United States Patent

Tan et al.

Patent Number: 5,429,905
Date of Patent: Jul. 4, 1995

[54] POSITIVE WORKING PHOTORESIST COMPOSITION CONTAINING NAPHTHOQUINONE DIAZIDE SULFONIC ACID ESTER OF POLYHYDROXY COMPOUND

[75] Inventors: Shiro Tan; Yasumasa Kawabe; Tadayoshi Kokubo, all of Shizuoka, Japan

[73] Assignee: Fuji Photo Film Co., Ltd., Kanagawa, Japan

[21] Appl. No.: 227,011

[22] Filed: Apr. 13, 1994

[30] Foreign Application Priority Data

Apr. 13, 1993 [JP] Japan ................... 5-085856

[51] Int. Cl.$^6$ ............................................. G03F 7/023
[52] U.S. Cl. ........................... 430/192; 430/165; 430/193; 534/557
[58] Field of Search ............. 430/191, 193, 192; 534/557

[56] References Cited

U.S. PATENT DOCUMENTS 5,290,658  3/1994  Uenishi et al. ................ 430/193

Primary Examiner—Charles L. Bowers, Jr.
Assistant Examiner—Christopher G. Young
Attorney, Agent, or Firm—Sughrue, Mion, Zinn, Macpeak & Seas

[57] ABSTRACT

The present invention relates to a positive-working photoresist composition comprising at least one of the 1,2-naphthoquinonediazido-5-sulfonic acid ester of a polyhydroxy compound represented by formula (1) and the 1,2-naphthoquinonediazido-4-sulfonic acid ester of a polyhydroxy compound represented by formula (1):

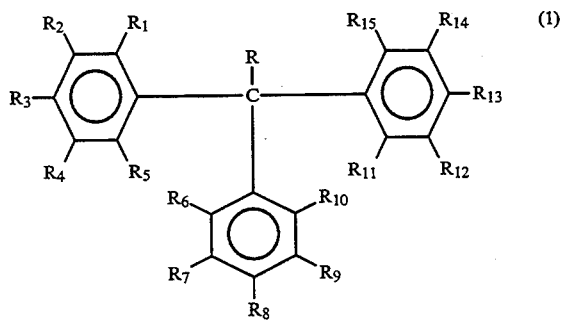

wherein R represents a hydrogen atom, a hydroxy group, a halogen atom, a nitro group, an alkyl group having from 1 to 6 carbon atoms, an aryl group, or an alkenyl group; and $R_1$ to $R_{15}$, which may be the same or different, each represents a hydrogen atom, a hydroxy group, a halogen atom, an alkyl group having from 1 to 6 carbon atoms, an alkoxy group, or a substituted or unsubstituted cycloalkyl group, with the proviso that at least one of $R_1$ to $R_{15}$ is a substituted or unsubstituted cycloalkyl group.

7 Claims, No Drawings

POSITIVE WORKING PHOTORESIST COMPOSITION CONTAINING NAPHTHOQUINONE DIAZIDE SULFONIC ACID ESTER OF POLYHYDROXY COMPOUND

FIELD OF THE INVENTION

The present invention relates to a positive-working photoresist composition which is sensitive to radiation, and more particularly, to a photoresist composition having a high resolving power, high sensitivity, and for finely working to form a pattern having a good cross-sectional form.

The positive-working photoresist of the present invention is coated on a substrate such as a semiconductor wafer, a glass plate, a ceramic, a metal, etc., at a thickness of from 0.5 to 3 $\mu$m by a spin coating method or a roller coating method. Thereafter, the coated layer is dried by heating, a circuit pattern, etc., is printed on the layer by ultraviolet irradiation, etc., through a light-exposure mask and developed to form a positive image.

Furthermore, by etching the photoresist layer using the positive image as a mask, a circuit pattern, etc., can be formed on the substrate.

Typical applications of the pattern-forming method are the production of semiconductor devices such as IC (integrated circuit), etc.; the production of circuit substrates such as liquid crystals, thermal heads, etc.; photofabrication steps, etc.

BACKGROUND OF THE INVENTION

As a positive-working photoresist composition, a composition containing an alkali-soluble resin and a naphthoquinonediazide compound as a photosensitive material is generally used. For example, such compositions are described in U.S. Pat. Nos. 3,666,473, 4,115,128, 4,173,470, etc., as "novolac-type phenol resin/naphthoquinonediazide substitution compound" and also, as the most typical positive-working photoresist composition, the examples of "a novolac resin composed of cresol-formaldehyde/trihydroxybenzophenone-1,2-naphthoquinonediazidosulfonic acid ester" are described in L. F. Thompson, *Introduction to Microlithography*, No. 219, pages 112–121, published by ACS.

Since the novolac resin, as the binder, is soluble in an aqueous alkali solution without being swelled and since, in the case of using the image formed as the mask for etching, the novolac resin gives a particularly high durability to plasma etching, the novolac resin is particularly useful as a photoresist composition.

Also, the naphthoquinonediazide compound being used as the photosensitive material functions as a dissolution inhibitor lowering the alkali solubility of the novolac resin by itself, but is unique in that when the compound is decomposed by being irradiated with light, the compound forms an alkali-soluble material and apparently functions to increase the alkali-solubility of the novolac resin. Further, because of the large property change by light, the naphthoquinonediazide compound is particularly useful as the photosensitive material for a positive-working photoresist composition.

Hitherto, from such a view point, many positive-working photoresist compositions each containing the novolac resin and the naphthoquinonediazide series photosensitive material have been developed and practically used, and the compositions have obtained a sufficient result in line-width working to the extent of from about 1.5 $\mu$m to 2 $\mu$m.

However, an integrated circuit is increasing the integration degree and, in the production of a semiconductor device such as a very large scale integrated circuit (LSI), etc., working of a very fine pattern composed of a line width of not wider than 1 $\mu$m has been required. In such a use, photoresist having a particularly high resolving power, a high pattern form- reproducing accuracy capable of accurately reproducing the form of a light-exposure mask, and a high sensitivity from the view point of a high productivity has been required. However, the conventional positive-working photoresists described above have not satisfied the foregoing requirements.

SUMMARY OF THE INVENTION

Thus, the objects of the present invention are to provide the following positive-working photoresist compositions which are, in particular, useful for the production of semiconductor devices.

That is, the 1st object of the present invention is to provide a positive-working photoresist composition having a high resolving power.

The 2nd object of the present invention is to provide a positive-working photoresist composition capable of accurately reproducing, over a wide range of the line width, the dimensions of a photomask.

The 3rd object of the present invention is to provide a positive-working photoresist composition capable of forming a resist pattern with a cross-sectional form having a high aspect ratio in a pattern of a line width of not wider than 1 $\mu$m.

The 4th object of the present invention is to provide a positive-working photoresist composition capable of forming a pattern wherein the side wall of the cross section of the pattern is almost vertical to the pattern plane.

The 5th object of the present invention is to provide a positive-working photoresist composition having a broad development latitude.

The 6th object of the invention is to provide a positive-working photoresist composition capable of giving a resist image excellent in heat resistance.

As the result of various investigations wherein the various characteristics of a positive-working photoresist composition described above were considered, the inventors have discovered that the foregoing objects can be attained by using an alkali-soluble resin and a quinonediazide compound having the specific structure as described hereinbelow and have succeeded in accomplishing the present invention based on the discovery.

That is, according to the present invention, there is provided a positive-working photoresist composition comprising at least one of the 1,2-naphthoquinonediazido-5-sulfonic acid ester of a polyhydroxy compound represented by formula (1) and the 1,2-naphthoquinonediazido-4-sulfonic acid ester of a polyhydroxy compound represented by formula (1) and an alkali-soluble resin;

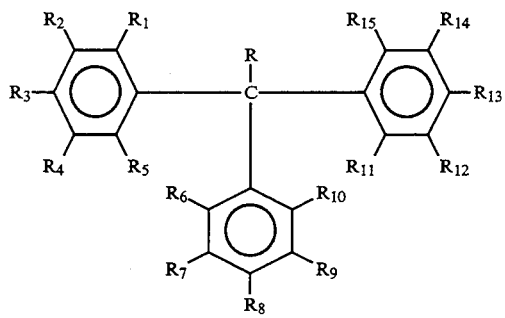

wherein R represents a hydrogen atom, a hydroxy group, a halogen atom, a nitro group, an alkyl group having from 1 to 6 carbon atoms, an aryl group, or an alkenyl group; and $R_1$ to $R_{15}$, which may be the same or different, each represents a hydrogen atom, a hydroxyl group, a halogen atom, an alkyl group having from 1 to 6 carbon atoms, an alkoxy group, or a substituted or unsubstituted cycloalkyl group with the proviso that at least one of $R_1$ to $R_{15}$ is a hydroxyl group and further at least one of $R_1$ to $R_{15}$ is a substituted or unsubstituted cycloalkyl group.

DETAILED DESCRIPTION OF THE INVENTION

Next, the present invention is described in detail.

First, the polyhydroxy compound represented by formula (1) is described.

With R in respect to formula (1), as the halogen atom, chlorine, bromine, and iodine are preferred; as the alkyl group having from 1 to 6 carbon atoms, methyl, ethyl, propyl, n-butyl, iso-butyl, sec-butyl, t-butyl, pentyl, and hexyl are preferred; as the aryl group, phenyl, tolyl, and xylyl are preferred; and, as the alkenyl group, vinyl and allyl are preferred.

With respect to $R_1$ to $R_{15}$ in formula (1), as the halogen atom, chlorine, bromine, and iodine are preferred; as the alkyl group having from 1 to 6 carbon atoms, methyl, ethyl, propyl, n-butyl, iso-butyl, sec-butyl, t-butyl, pentyl, and hexyl are preferred; as the alkoxy group, methoxy, ethoxy, hydroxyethoxy, propoxy, hydroxypropoxy, iso-propoxy, n-butoxy, iso-butoxy, sec-butoxy, and t-butoxy are preferred; and, as the cycloalkyl group, cyclohexyl, cyclopentyl, cyclobutyl, cycloheptyl, and cyclooctyl are preferred.

The polyhydroxy compound represented by formula (1) of the present invention can be obtained by the dehydrocondensation reaction of a phenolic compound having a cycloalkyl substituent and a substituted or unsubstituted aromatic aldehyde compound under an acidic condition or by the dehydrocondensation reaction of a substituted or unsubstituted phenolic compound and an aromatic aldehyde compound having a cycloalkyl substituent under an acidic condition. Furthermore, in the foregoing reactions, a substituted or unsubstituted aromatic carbonyl compound can also be used in place of the aromatic aldehyde compound.

Specific examples of the polyhydroxy compound represented by formula (1) are illustrated below, however the polyhydroxy compound of the present invention is not limited to these compounds.

These compounds may be used singly or in combination thereof.

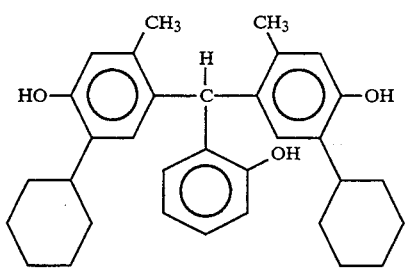

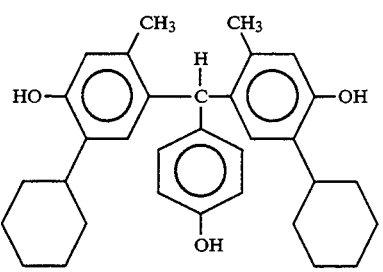

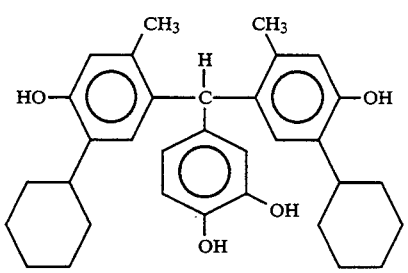

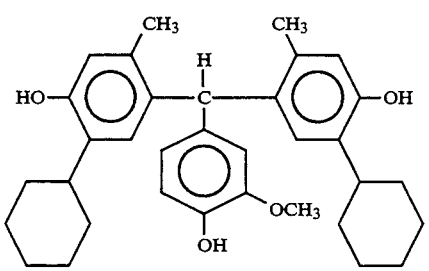

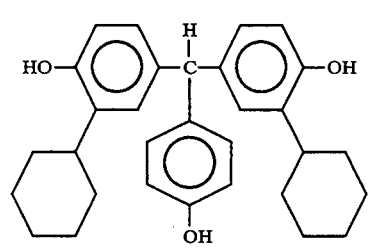

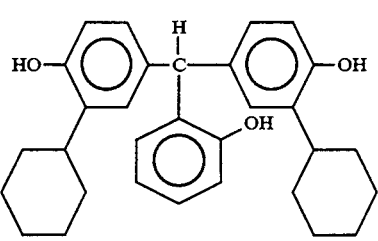

-continued

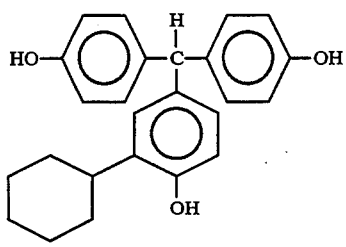 (vii)

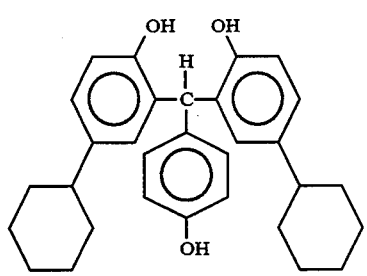 (viii)

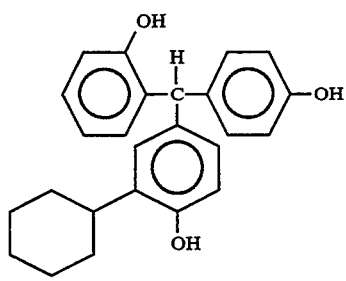 (ix)

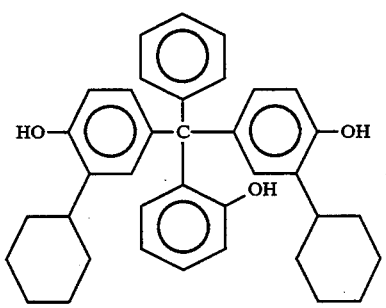 (x)

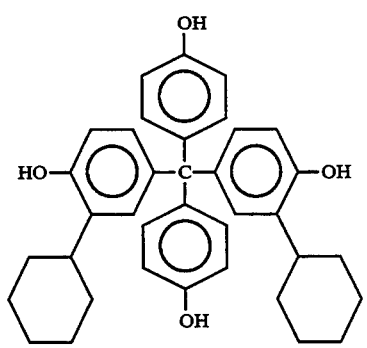 (xi)

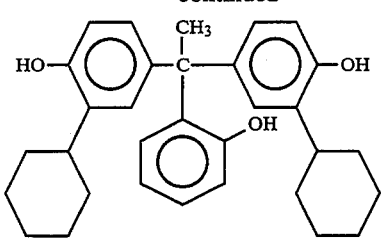 (xii)

The 1,2-naphthoquinonediazido-5-sulfonic acid ester and/or the 1,2-naphthoquinonediazido-4-sulfonic acid ester of the polyhydroxy compound represented by formula (1) of the present invention can be obtained by carrying out an ordinary esterification reaction of a part or the whole of the hydroxy groups of the polyhydroxy compound shown by the formula (1) and 1,2-naphthoquinonediazido-5-sulfonyl chloride and/or 1,2-naphthoquinonediazido-4-sulfonyl chloride in the presence of a basic catalyst.

The polyhydroxy compound and 1,2-naphthoquinonediazido-5-sulfonylchloride and/or 1,2-naphthoquinonediazido-4-sulfonyl chloride are placed in a flask together with a solvent such as dioxane, acetone, methyl ethyl ketone, N-methylpyrrolidone, etc., and then a basic catalyst such as sodium hydroxide, sodium carbonate, sodium hydrogencarbonate, triethylamine, etc., is added dropwise to the mixture to cause a condensation reaction. The product obtained is washed with water, purified and dried.

In the above-described esterification reaction, a mixture of the products each having a different esterification number and esterified position is obtained. Accordingly, the esterification ratio in this invention is defined as the average value of the mixture of the products.

The esterification ratio thus defined can be controlled by the mixing ratio of the raw materials, i.e., the polyhydroxy compound shown by formula (1) and 1,2-naphthoquinonediazido-5-sulfonyl chloride and/or 1,2-naphthoquinonediazido-4-sulfonyl chloride.

That is, the addition of 1,2-naphthoquinonediazido-5-sulfonyl chloride and/or 1,2-naphthoquinonediazido-4-sulfonyl chloride cause the esterification reaction and, hence, for obtaining a mixture of the products having a desired esterification ratio, the mol ratio of the raw material may be controlled.

In the present invention, if necessary, the 1,2-naphthoquinonediazido-5-sulfonic acid ester and the 1,2-naphthoquinonediazido-4-sulfonic acid ester can be used together.

Also, the reaction temperature for the reactions described above is generally from $-20°$ C. to $60°$ C., and preferably from $0°$ C. to $40°$ C.

When used as a positive-working photoresist composition, the photosensitive compounds of the present invention may be compounded with an alkali-soluble resin singly or as a mixture thereof. In this case, the compounding amount of the photosensitive compound(s) is generally from 5 to 100 parts by weight, and preferably from 10 to 50 parts by weight to 100 parts by weight of the alkali-soluble resin. If the compounding amount thereof is less than 5 parts by weight, the residual film ratio is greatly lowered, while if the compounding amount is over 100 parts by weight, the sensitivity of the photoresist composition and the solubility thereof in a solvent are lowered.

Examples of the alkali-soluble resins which may be used in the present invention include a novolac resin, an acetone-pyrogallol resin, polyhydroxystyrene, and the derivatives of polyhydroxystyrene.

In these alkali-soluble resins, a novolac resin is particularly preferred and the novolac resin can be obtained by addition-condensing a specific monomer as shown below as the main component and an aldehyde in the presence of an acidic catalyst.

As the specific monomer being used for the foregoing addition-condensation reaction, hydroxy aromatic compounds, e.g., phenol; cresols such as m-cresol, p-cresol and o-cresol; xylenols such as 2,5-xylenol, 3,5-xylenol, 3,4-xylenol and 2,3-xylenol; alkylphenols such as m-ethylphenol, p-ethylphenol, o-ethylphenol and p-t-butylphenol; trialkylphenols such as 2,3,5-trimethylphenol and 2,3,4-trimethylphenol; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol; bisalkylphenols such as 2-methyl-4-isopropylphenol; m-chlorophenol, p-chlorophenol, o-chlorophenol, dihydroxybiphenyl, bisphenol A, phenylphenol, resorcinol and naphthol can be used singly or as a mixture thereof although the monomers are not limited to these compounds.

Examples of aldehydes to be used in the present invention include formaldehyde, para-formaldehyde, acetaldehyde, propylaldehyde, benzylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfuran, chloroacetaldehyde, and the acetal compound thereof, such as chloroacetoaldehyde diethyl acetal.

In these compounds, formaldehyde is preferably used.

These adlehydes can be used singly or in combination thereof.

As the acidic catalyst, hydrochloric acid, sulfuric acid, formic acid, acetic acid, oxalic acid, etc., can be used.

The weight average molecular weight of the novolac resin thus obtained is preferably in the range of from 2,000 to 30,000. Generally, if the weight average molecular weight is less than 2,000, decreasing of the photoresist layer at the unexposed portions after development is large, while if the weight average molecular weight is over 30,000, the development speed is reduced. A more preferred weight average molecular weight is from 6,000 to 20,000.

The weight average molecular weight is defined by the polystyrene converted value in gel permeation chromatoraphy.

In the present invention, in addition to the 1,2-naphthoquinonediazido-5-sulfonic acid enter and/or the 1,2-naphthoquinonediazido-4-sulfonic acid enter of a polyhydroxy compound represented by formula (1) the photosensitive material described above is necessarily used, but if desired, an ester compound of the 1,2-naphthoquinonediazido-5-sulfonyl chloride and/or the 1,2-naphthoquinonediazido-4-sulfonyl chloride of a polyhydroxy compound shown below can be used.

Examples of such an additional polyhydroxy compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone; polyhydroxyphenyl alkyl ketones such as 2,3,4-trihydroxyacetophenone, 2,3,4-trihydroxyphenyl pentyl ketone and 2,3,4-trihydroxyphenyl hexyl ketone; bis((poly)hydroxyphenyl)alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid; polyhydroxybenzoic acid esters such as propyl 3,4,5-trihydroxybenzoate and phenyl 2,3,4-trihydroxybenzoate, phenyl 3,4,5-trihydroxybenzoate; bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene; alkylene di(polyhydroxybenzoates) such as ethylene glycol di(3,5-dihydroxybenzoate) and ethylene glycol di(3,4,5-trihydroxybenzoate); polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol and 2,3,4,2',3',4'-biphenylhexol; bis(polyhydroxy)sulfides such as 4,4'-thiobis(1,3-dihydroxy)benzene; bis(polyhydroxyphenyl) thers such as 2,2',4,4'-tetrahydroxy diphenyl ether; bis(polyhydroxyphenyl) sulfoxides such as 2,2',4,4'-tetrahydroxydiphenyl sulfoxide; bis(polyhydroxyphenyl)sulfones such as 2,2',4,4'-diphenylsulfone; polyhydroxytriphenylmethanes such as 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5'-diacetyltriphenylmethane and 2,4,6,2',4',6'-hexahydroxy-5,5'-dipropionyltriphenylmethane; polyhydroxyspirobiindanes such as 3,3,3',3'-tetramethyl-1,1'-spirobiindane-5,6,6',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol and 3,3,3',3'-tetramethyl-1,1'-spirobiindane-4,5,6,5',6',7'-hexol; polyhydroxyphthalides such as 3,3-bis(3,4-dihydroxyphenyl)phthalide, 3,3-bis(2,3,4-trihydroxyphenyl)phthalide and 3',4',5',6'-tetrahydrocyspiro[phthalido-3,9'-xanthene]; and flavono dyes such as morin, kersetin, rutin, etc., can be used.

Also, the low nuclides of phenol resins such as a novolac resin, etc., can be used.

The naphthoquinonediazide ester photosensitive materials of these polyhydroxy compounds may be used singly or as a combination thereof.

The positive-working photoresist composition of the present invention can further contain a polyhydroxy compound for accelerating the solubility thereof in a developing solution.

Preferred examples of such a polyhydroxy compound include phenols, resorcinol, phloroglucianol, 2,3,4-trihydroxybenzophenone, 2,3,4,4'-tetrahydroxybenzophenone, 2,3,4,3',4',5'-hexahydroxybenzophenone, an acetone-pyrogallol condensation resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, and 2,2',4,4'-tetrahydroxydiphenylsulfone.

Generally, the polyhydroxy compound can be compounded in the range of not more than 100 parts by weight, and preferably from 5 to 50 parts by weight to 100 parts by weight of the quinonediazide compound.

As the solvent for dissolving the photosensitive material used in the present invention and the alkali-soluble novolac resin, there are ketones such as methyl ethyl ketone and cyclohexanone; keto ethers such as 4-ethoxy-2-butanone and 4-methoxy-4-methyl-2-pentanone; alcohol ethers such as ethylene glycol monomethyl ether and ethylene glycol monoethyl ether; ethers such as dioxane and ethylene glycol dimethyl ether; cellosolve esters such as methylcellosolve acetate and ethylcellosolve acetate; fatty acid esters such as butyl acetate, methyl lactate and ethyl lactate; halogenated hydrocarbons such as 1,1,2-trichloroethylene; high-polar solvents such as dimethylacetamide, N-methylpyrrolidone, dimethylformamide and dimethylsulfoxide.

These solvents can be used singly or as a mixture thereof.

The positive-working photoresist composition of the present invention can also contain a surface active agent for further improving the coating property of a striation, etc.

Examples of the surface active agent which can be used in the present invention are nonionic surface active agents (e.g., polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylenepolyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate); fluorine series surface active agents such as FTop EF301, FTop EF303, and FTtop EF352 (trade names, made by Shin Akita Kasei K.K.), Megafax F171 and Megafax F 173 (trade names, made by Dainippon Ink and Chemicals, Inc.), Fluorad FC430, Fluorad FC430, and Fluorad FC431 (trade names, made by Sumitomo 3M Limited), Asahi Guard AG710 and Surflon S-382, SC101, SC102, SC103, SC104, SC105, and SC106 (trade names, made by Asahi Glass Co., Ltd.), etc.; an organosiloxane polymer, KP341 (trade name, made by Shin-Etsu Chemical Co., Ltd.); an acrylic acid series and a methacrylic acid series (co)polymer, Polyflow No. 75 and No. 95 (trade names, made by Kyoeisha Yushi Kagaku Kogyo K.K.).

The compounding amount of the surface active agent is usually not more than 2 parts by weight, and preferably not more than 1 part by weight to 100 parts by weight of the sum of the alkali-soluble resin and the quinonediazide compound in the composition of the present invention.

These surface active agents can be used singly or as a combination of them.

As the developing solution of the positive-working photoresist composition of the present invention, an aqueous solution of an alkali, e.g., an inorganic alkali such as sodium hydroxide, potassium hydroxide, sodium carbonate, sodium silicate, sodium metasilicate and aqueous ammonia; a primary amine such as ethylamine, n-propylamine; a secondary amine such as diethylamine and di-n-butylamine; a tertiary amine such as triethylamine and methyldiethylamine; an alcoholamine such as dimethylethanolamine and triethanolamine; a quaternary ammonium salt such as tetramethylammonium hydroxide and tetraethylammonium hydroxide; and a cyclic amine such as pyrrole and piperidine can be used.

Furthermore, the aqueous solution of the foregoing alkali may contain an alcohol and a surface active agent at use, if necessary.

The positive-working photoresist composition of the present invention can further contain, if necessary, a dye, a plasticizer, and/or an adhesion aid.

Specific examples of these additives are dyes such as Methyl Violet, Crystal Violet, Malachite Green, etc.; plasticizers such as stearic acid, an acetal resin, a phenoxy resin, an alkyd resin, etc.; and adhesive aids such as hexamethyldisilazane, chloromethylsilane, etc.

The positive-working photoresist composition of the present invention described above is coated on a substrate (e.g., silicon dioxide-covered silicon) by a proper coating method such as a spin coating, etc., light-exposed through a definite mask, and developed, whereby a good resist can be obtained.

The following examples are intended to illustrate the present invention practically but not to limit it in any way. In addition, the percent (%) in the examples, unless otherwise indicated, is by weight.

EXAMPLES 1 TO 3, COMPARISON EXAMPLES 1 AND 2

(1) Synthesis of Photosensitive Material a:

In a three-neck flask were placed 69.1 g of Compound (i) shown in Table 1 described below, 80.6 g of 1,2-naphthoquinonediazido-5-sulfonyl chloride, and 600 ml of acetone followed by mixing to form a uniform solution. Then, 100 ml of acetone containing 31.9 g of triethylamine was gradually added dropwise to the solution and the reaction was carried out for 3 hours at 25° C. The reaction mixture thus obtained was poured into 3,000 ml of an aqueous 1% hydrochloric acid solution and the precipitates thus formed were recovered by filtration, washed with water, and dried at 40° C. to provide 131.8 g of the 1,2-naphthoquinonediazido-5-sulfonic acid ester (Photosensitive Material a) of the compound (i).

(2) Synthesis of Photosensitive Material b:

In a three-neck flask were placed 66.0 g of Compound (ii) shown in Table 1 described below, 80.6 g of 1,2-naphthoquinonediazido-5-sulfonyl chloride, and 600 ml of acetone followed by mixing to provide a uniform solution. Then, 100 ml of acetone containing 31.9 g of triethylamine was gradually added dropwise to the solution and the reaction was carried out for 5 hours at 25° C. The reaction mixture thus obtained was poured into 3,000 ml of an aqueous 1% hydrochloric acid solution and the precipitates thus formed were recovered by filtration, washed with water, and dried at 40° C. to provide 122.1 g of the 1,2-naphthoquinonediazido-5-sulfonic acid ester (Photosensitive Material b) of the compound (ii).

(3) Synthesis of Photosensitive Material c:

In a three-neck flask were placed 59.5 g of Compound (viii) shown in Table 1 described below, 80.6 g of 1,2-naphthoquinonediazido-5-sulfonyl chloride, and 600 ml of acetone followed by mixing to provide a uniform solution. Then, 100 ml of acetone containing 31.9 g of triethylamine was gradually added dropwise to the solution and the reaction was carried out for 5 hours at 25° C. The reaction mixture thus obtained was poured into 3,000 ml of an aqueous 1% hydrochloric acid solution and the precipitates were recovered by filtration, washed with water, and dried at 40° C. to provide 122.7 g of the 1,2-naphthoquinonediazido-5-sulfonic acid ester (Photosensitive Material c) of the compound (viii).

(4) Synthesis of Photosensitive Material d:

In a three-neck flask were placed 11.5 g of 2,3,4-trihydroxybenzophenone, 30.2 g of 1,2-naphthoquinonediazido-5-sulfonyl chloride, and 300 ml of acetone followed by mixing to provide a uniform solution. Then, 50 ml of acetone containing 11.4 g of triethylamine was gradually added dropwise to the solution and the reaction was carried out for 3 hours at 25° C. The reaction mixture thus obtained was poured into 1,500 ml of an aqueous 1% hydrochloric acid solution and the precipitates thus formed were recovered by filtration, washed with water, and dried at 40° C. to provide 29.8 g of the 1,2-naphthoquinonediazido-5-sulfonic acid ester (Photosensitive Material d) of 2,3,4-trihydroxybenzophenone.

(5) Synthesis of Photosensitive Material e:

In a three-neck flask were placed 12.3 g of 2,3,4,4'-tetrahydroxybenzophenone, 40.3 g of 1,2-naphthoquinonediazido-5-sulfonyl chloride, and 300 ml of acetone followed by mixing to provide a uniform solution. Then, 50 ml of acetone containing 15.2 g of triethylamine was gradually added dropwise to the solution and the reaction was carried out for 3 hours at 25° C. The reaction mixture thus obtained was poured into 1,500 ml of an aqueous 1% hydrochloric acid solution and the precipitates thus formed were recovered by filtration, washed with water, and dried at 40° C. to provide 39.7 g of the 1,2-naphthoquinonediazido-5-sulfonic acid ester (Photosensitive Material d) of 2,3,4,4'-tetrahydroxybenzophenone.

(6) Synthesis of Novolac Resin:

In a three-neck flask were placed 40 g of m-cresol, 60 g of p-cresol, 49 g of an aqueous 37% formaldehyde solution, 0.13 g of oxalic acid and after raising the temperature to 100° C. with stirring, the reaction was carried out for 15 hours.

Thereafter, the temperature was raised to 200° C. and the pressure was gradually reduced to 5 mmHg to remove the remaining water, unreacted monomers, formaldehyde, oxalic acid, etc. Then, after lowering the temperature of the molten alkali-soluble novolac resin to room temperature, the product was recovered. The weight average molecular weight of the novolac resin obtained was 7,100 (polystyrene standard).

(7) Preparation of Positive-Working Photoresist Composition and Evaluation Thereof:

In 15 g of ethylcellosolve acetate were dissolved 1.3 g of each of the photosensitive materials a to e obtained in the Syntheses (1) to (5) described above and 5 g of the cresol-novolac resin (molecular weight 7,100) obtained in the synthesis (6) described above, and the solution was filtered using a microfilter of 0.2 μm to provide a photoresist composition. The photoresist composition was coated on a silicon wafer by spin coating and by drying the coated layer with a vacuum adsorption type hot plate for 90 seconds at 100° C., and a resist layer having a thickness of 1.2 μm was formed on the silicon wafer.

After light-exposing the photoresist layer using a reduced projection exposure apparatus (Reduced Projection Exposure Apparatus FPA-1550, trade name, made by CANON Inc.), the layer was developed with an aqueous solution of 2.38% tetramethylammonium hydroxide for 1 minute, washed with water for 30 seconds, and dried.

The resist pattern on the silcon wafer thus formed was observed with a scanning type electron microscope and the resist formed was evaluated. The results are shown in Table 2 below.

The sensitivity was defined as the reciprocal of the light exposure amount of reproducing the mask pattern of 0.7 μm and was shown by the relative value to the sensitivity of the sample of Comparison Example 1.

The residual film ratio was shown by the percentage of the ratio of the unexposed portion before and after the development.

The resolving power was shown by the critical resolving power in the exposure amount of reproducing the mask pattern of 0.7 μm.

When the silicon wafer, having formed thereon the resist pattern was baked in a convention oven for 30 minutes, the heat resistance was shown as the temperature when the deformation of the resist pattern did not occur.

The form of the resist was shown by the angle ($\theta$) formed by the wall plane of the section of the resist pattern of 0.7 μm and the plane of the silicon wafer.

TABLE 1

| Photo-sensitive Material | Compound |
|---|---|
| a | (i) |

TABLE 1-continued

| Photo-sensitive Material | Compound | |
|---|---|---|
| b | (structure: bis(4-hydroxy-3-methyl-5-cyclohexylphenyl)(4-hydroxyphenyl)methane) | (ii) |
| c | (structure: bis(3-hydroxy-5-cyclohexylphenyl)(4-hydroxyphenyl)methane) | (viii) |
| d | 2,3,4-Trihydroxybenzophenone | |
| e | 2,3,4,4'-Tetrahydroxybenzophenone | |

TABLE 2

| No. | Photo-sensitive Material | Relative Sensitivity | Residual Film Ratio (%) | Resolving Power (μm) | Heat Resistance (°C.) | Form of Resist (θ) |
|---|---|---|---|---|---|---|
| Example 1 | a | 1.3 | 100 | 0.50 | 160 | 88 |
| Example 2 | b | 1.4 | 100 | 0.50 | 160 | 89 |
| Example 3 | c | 1.2 | 100 | 0.50 | 160 | 89 |
| Comparison Example 1 | d | 1.0 | 98 | 0.60 | 140 | 84 |
| Comparison Example 2 | e | 1.1 | 98 | 0.55 | 140 | 83 |

As is clear from the results shown in the above table, it can be seen that the resists (Examples 1 to 3) using the photosensitive materials a to c of the present invention are particularly excellent in the resolving power and the resist form as compared to the resists (Comparison Examples 1 and 2) using the photosensitive materials d and e.

The photosensitive materials of the present invention had excellent solubility in ethylene glycol monoethyl ether acetate and, when the resist composition solutions using the photosensitive materials were allowed to stand for 50 days at 40° C., precipitates were not deposited. However, when the resist composition solutions using the comparison photosensitive materials d and e were allowed to stand under the same conditions as above, the deposition of precipitates was observed in the resist compositions.

As described above, the positive-working photoresist of the present invention is excellent in the resolving power, the sensitivity, the developing property, and the heat resistance and is suitably used as a photoresist for fine working.

While the invention has been described in detail and with reference to specific embodiments thereof, it will be apparent to one skilled in the art that various changes and modifications can be made without departing from the spirit and scope thereof.

What is claimed is:

1. A positive-working photoresist composition comprising at least one of the 1,2-naphthoquinonediazido-5-sulfonic acid ester of a polyhydroxy compound represented by formula (1) and the 1,2-naphthoquinonediazido-4-sulfonic acid ester of a polyhydroxy compound represented by formula (1);

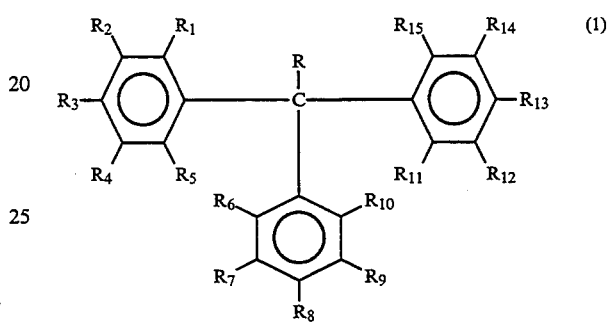

(1)

wherein R represents a hydrogen atom, a hydroxy group, a halogen atom, a nitro group, an alkyl group having from 1 to 6 carbon atoms, an aryl group, or an alkenyl group; and $R_1$ to $R_{15}$, which may be the same or different, each represents a hydrogen atom, a hydroxy group, a halogen atom, an alkyl group having from 1 to 6 carbon atoms, an alkoxy group, or a cycloalkyl group, with the proviso that at least one of $R_1$ to $R_{15}$ is a hydroxy group and at least one of $R_1$ to $R_{15}$ is a cycloalkyl group.

2. A positive-working photoresist composition as in claim 1, wherein said polyhydroxy compound represented by formula (1) is selected from the group consisting of:

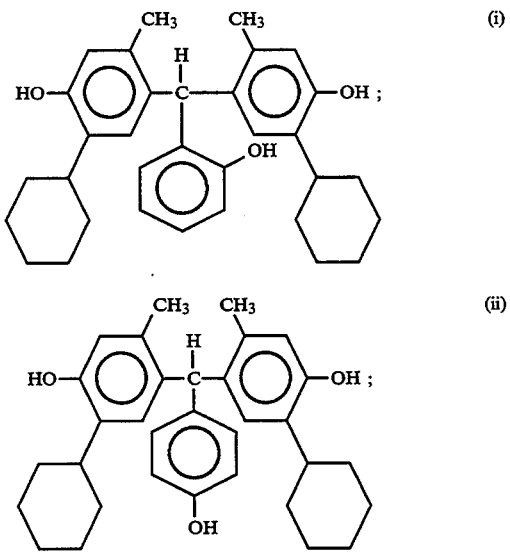

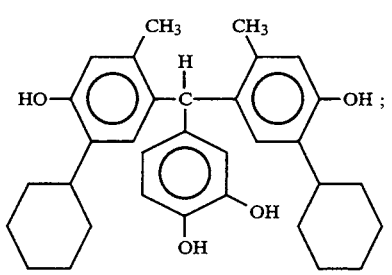 (iii)

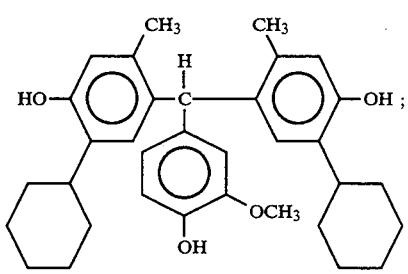 (iv)

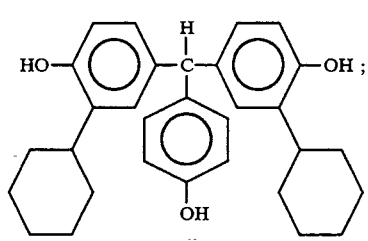 (v)

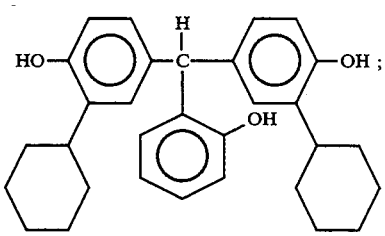 (vi)

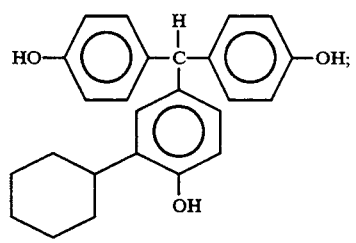 (vii)

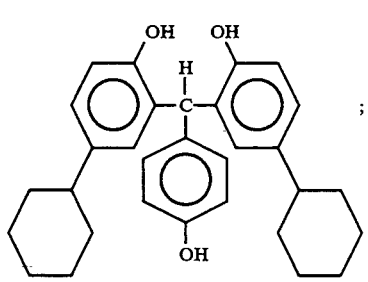 (viii)

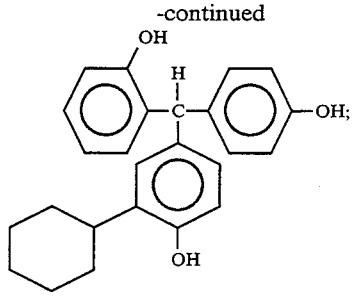 (ix)

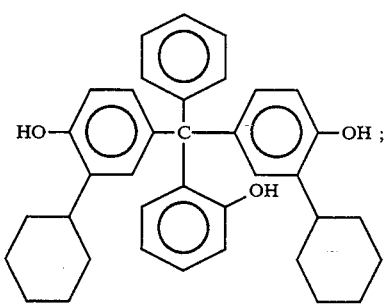 (x)

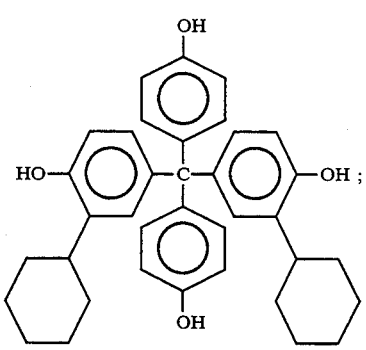 (xi)

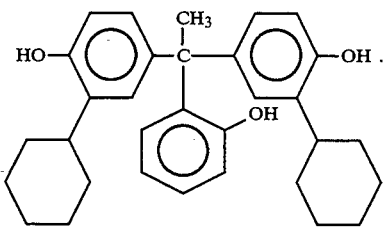 (xii)

3. A positive-working photoresist composition as in claim 1, wherein said positive-working photoresist composition further comprises an alkali-soluble resin.

4. A positive-working photoresist composition as in claim 3, wherein said alkali-soluble resin is a novolac resin.

5. A positive-working photoresist composition as in claim 3, wherein said at least one of the 1,2-naphthoquinonediazido-5-sulfonic acid ester of a polyhydroxy compound represented by formula (1) and the 1,2-naphthoquinonediazido-4-sulfonic acid ester of a polyhydroxy compound represented by formula (1) is present in an amount of from 5 to 100 parts by weight based on 100 parts by weight of the alkali-soluble resin.

6. A positive-working photoresist composition comprising the 1,2-naphthoquinonediazido-5-sulfonic acid ester of a polyhydroxy compound represented by formula (1):

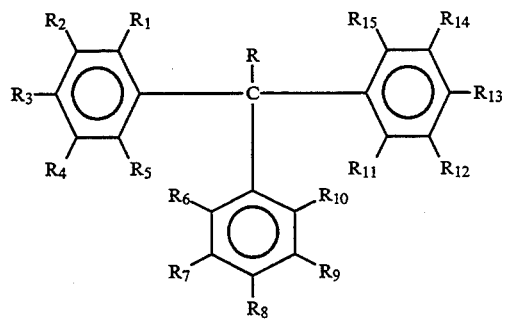

wherein R represents a hydrogen atom, a hydroxy group, a halogen atom, a nitro group, an alkyl group having from 1 to 6 carbon atoms, an aryl group, or an alkenyl group; and $R_1$ to $R_{15}$, which may be the same or different, each represents a hydrogen atom, a hydroxy group, a halogen atom, an alkyl group having from 1 to 6 carbon atoms, an alkoxy group, or a cycloalkyl group, with the proviso that at least one of $R_1$ to $R_{15}$ is a cycloalkyl group.

7. A positive-working photoresist composition comprising the 1,2-naphthoquinonediazido-4-sulfonic acid ester of a polyhydroxy compound represented by formula (1):

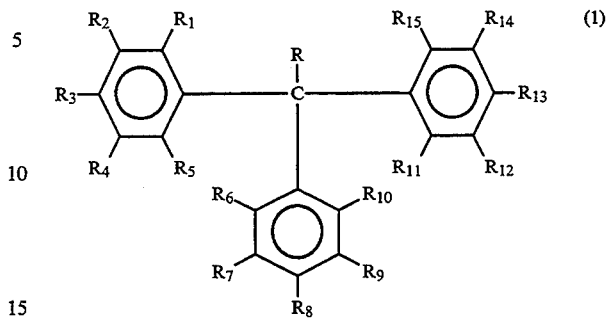

wherein R represents a hydrogen atom, a hydroxy group, a halogen atom, a nitro group, an alkyl group having from 1 to 6 carbon atoms, an aryl group, or an alkenyl group; and $R_1$ to $R_{15}$, which may be the same or different, each represents a hydrogen atom, a hydroxy group, a halogen atom, an alkyl group having from 1 to 6 carbon atoms, an alkoxy group, or a cycloalkyl group, with the proviso that at least one of $R_1$ to $R_{15}$ is a hydroxy group and at least one of $R_1$ to $R_{15}$ is a substituted or unsubstituted cycloalkyl group.

* * * * *